United States Patent [19]

Weinstein et al.

[11] Patent Number: 5,539,832
[45] Date of Patent: Jul. 23, 1996

[54] MULTI-CHANNEL SIGNAL SEPARATION USING CROSS-POLYSPECTRA

[75] Inventors: Ehud Weinstein, Ramat Gan; Daniel Yellin, Karmei Yosef, both of Israel

[73] Assignee: Ramot University Authority for Applied Research & Industrial Development Ltd., Tel-Aviv, Israel

[21] Appl. No.: 43,089

[22] Filed: Apr. 5, 1993

[30] Foreign Application Priority Data

Apr. 10, 1992 [IL] Israel ........................................ 101556

[51] Int. Cl.⁶ .................................................. H04B 15/00
[52] U.S. Cl. .......................................................... 381/94
[58] Field of Search ........................ 381/71–94; 342/192, 342/116; 128/731, 696; 364/724.19

[56] References Cited

U.S. PATENT DOCUMENTS

| | | |
|---|---|---|
| 3,935,574 | 1/1976 | Pentheroudakis . |
| 4,283,795 | 8/1981 | Steinberger . |
| 4,320,535 | 3/1982 | Brady et al. . |
| 4,473,906 | 9/1984 | Warnaka et al. . |
| 4,499,601 | 2/1985 | Matthews et al. . |
| 4,672,674 | 6/1987 | Clough et al. ............................ 381/94 |
| 5,020,540 | 6/1991 | Chamoun ................................ 128/696 |
| 5,208,786 | 5/1993 | Weinstein et al. . |
| 5,237,618 | 8/1993 | Bethel ..................................... 381/94 |

FOREIGN PATENT DOCUMENTS

| | | |
|---|---|---|
| 0149981 | 7/1985 | European Pat. Off. . |
| 0210609 | 7/1986 | European Pat. Off. . |
| WO88/10540 | 12/1988 | WIPO . |

OTHER PUBLICATIONS

Widrow et al., "Adaptive Noise Cancelling: Principles and Applications," *IEEE* vol. 63, No. 12 (Dec. 1975), pp. 1692–1716.

International Conference on Acoustics Speech and Signal Processing vol. 4, No. E6.5, 26 May 1989, Glasgow, GB pp. 2322–2324. Dianat et al.

Signal Processing, vol. 24, No. 1, Jul. 1991, pp. 11–20 Comon et al.

S. W. Nam, et al., "Utilization of Digital Polyspectral Analysis to Estimate Transfer Functions . . . " IEEE, CH 2673-2/89/0000–2306, Feb. 1989.

Brooks, Dana H.; "The Cross–Bicepstrum: Properties and Applications for signal Reconstruction and System Identification" IEEE, CH2977-7/91/0000–3433.

Forster, Phillippe; "Bearing Estimation in the Bispectral Domain" IEEE Trans. Signal Processing vol. 39 No. 9, Sep. 1991.

Tachi, S., "Separation of a Periodic Signal in Noise by Bispectrum Analysis," Dec. 1973, Trans. Soc Ins & Contrsl Eng. vol. 9, No. 6 pp. 729–738.

Chang, Michael M. et al. "Blur Identification Using the Bispectrum," IEEE Trans. Sig. Proc. vol. 39 No. 10, Oct. 1991.

Petropulu, Athina P. et al., "Blind Deconvolution Using Signal Reconstruction . . . " IEEE Trans Sig. Proc vol. 41 No. 6, Jun. 1993.

Widrow and Stearm, Adaptive Signal Processing, 1985, pp. 128–131.

*Primary Examiner*—Forester W. Isen
*Attorney, Agent, or Firm*—Benjamin J. Barish

[57] ABSTRACT

A signal processing system includes a plurality of detectors for detecting signals, each detector receiving signals from plural sources; and a processor for receiving the detected signals and producing a reconstruction filter for filtering the detected signals to produce reconstructed source signals in which each source signal is reconstructed without interference from the other source signals. The reconstruction filter is produced such that cross-polyspectra of the reconstructed signals are forced to approach zero.

13 Claims, 6 Drawing Sheets

MULTI-CHANNEL SIGNAL SEPARATION USING CROSS-POLYSPECTRA

BACKGROUND OF THE INVENTION

The problem of separating two or more signals that are superimposed on each other arise in many signal processing applications. A classical example is the problem of enhancing a desired speech signal in the presence of interference, or separating competing speakers using multiple microphone measurements. Another example is the problem of detecting a signal in the presence of directional interference, or detecting and localizing several spatially separated sources, by simultaneous observation of their signals using a spatially distributed array of receivers. Since the source signals as well as the transmission channel that couples the signals to the receivers are generally unknown, the problem of decoupling and identifying the two can not be solved unless we make some simplifying assumptions. In many cases of interest the channel can be modeled as a stable linear time invariant (LTI) system, and since the signals are generated by different sources we may also assume that they are statistically independent. The question is then whether these assumptions are sufficient for separating and recovering the source signals.

A recent series of papers (1)—C. Jutten, and J. Herault, "Blind separation of sources, part I: An adaptive algorithm based on neuromimetic architecture," *Signal Processing*, vol 24, No. 1, pp 1–10, July 1991, (2)—P. Comon, C. Jutten, and J. Herault, "Blind separation of sources, part II: Problems statement," *Signal Processing*, vol 24, No. 1, pp 11–20, July 1991, and (3)—E. Sorouchyari, C. Jutten, and J. Herault, "Blind separation of sources, part III: Stability analysis," *Signal Processing*, vol 24, No. 1, pp 21–29, July 1991, consider the problem of source separation for the special case in which the observed signals at each point in time are given by unknown but fixed linear combinations of the source signals (i.e. the unknown channel is a constant gain matrix). These papers contains several important observations.

First, it is pointed out that for the purpose of source separation it may be sufficient to assume that the signals are statistically independent. No additional information concerning the stochastic nature of each of the sources signals is required. To separate the sources it is then suggested to try and make the recovered signals statistically independent. However, tests for statistical independence are generally complicated, and require prior assumptions concerning the underlying probability distribution of each of the signals. Therefore, to solve the problem it is suggested to use an objective function consisting of high order statistics of the reconstructed signals, and then apply an algorithm to minimize that objective. If the algorithm converges, then at the point of convergence it attempts to minimize the correlation between some pre-specified non-linear functions of the reconstructed signals computed at the same sampling instance. Lack of correlation between non-linear functions of samples of the reconstructed processes is a weaker condition than statistical independence between samples of the processes, which is a weaker condition than statistical independence between the entire processes. However, because of the simplified channel model, it is a sufficient condition for signal separation. In fact it can be shown that decorrelating the reconstructed signals at the same sampling time is also sufficient in this case (not as stated in paper (1) above).

Patent application Ser. No. 07/750,917, filed Aug. 28, 1991 by E. Weinstein (one of the joint inventors in the present application), M. Feder and A. V. Oppenheim, for "Multi-Channel Signal Separation", assigned to Massachusetts Institute of Technology, (unpublished), considers the more general problem in which the channel is modeled as multi-input-multi-output (MIMO) LTI system. In the above patent application, it is suggested to separate and recover the input (source) signals by imposing the condition that the reconstructed signals be statistically uncorrelated. As it turns out, the decorrelation condition is insufficient to uniquely solve the problem, unless we make certain assumptions concerning the unknown channel, e.g. that it is a MIMO finite impulse response (FIR) filter.

For simplicity we shall concentrate specifically in the two channel case, in which we observe the outputs of an unknown 2×2 system, from which we want to recover its input signals. However we note that all the analysis and results can easily be extended to the more general case. In the two channel case it is desired to estimate the two source signals $s_1[n]$ and $s_2[n]$, from the observation of the two output signals $y_1[n]$ and $y_2[n]$. In some applications one of the signals, $s_1[n]$ is the desired signal, while the other signal, $s_2[n]$, is the interference or noise signal. Both the desired and the noise signals are coupled through an unknown system to form the observed signals.

Mathematical Preliminaries

A. Linear Systems

A stable single-input single-output (SISO) linear time invariant (LTI) system is characterized by its unit sample response $h[n]$, or by its transfer function (also called frequency response) $H(w)$, defined as the Fourier transform of $h[n]$:

$$H(w) = \sum_n h[n] e^{-jnw}$$

where $\Sigma_n$ denotes summation over all possible values of n. The output $y[n]$ of an LTI system is related to its input $s[n]$ by:

$$y[n] = s[n] \circ y[n] = \sum_l y[l] s[n - l]$$

where "o" denotes the convolution operation.

A stable multi-input multi-output (MIMO) LTI system is also characterized by its unit sample response, or by its transfer function (also called frequency response). For example, a two-input two-output stable LTI system is characterized by its 2×2 unit sample response matrix:

$$h[n] = \begin{bmatrix} h_{11}[n] & h_{12}[n] \\ h_{21}[n] & h_{22}[n] \end{bmatrix}$$

where $h_{ij}[n]$ i,j=1,2 are the unit sample response of SISO LTI systems. The transfer function of a 2×2 system is:

$$H[w] = \begin{bmatrix} H_{11}[w] & H_{12}[w] \\ H_{21}[w] & H_{22}[w] \end{bmatrix}$$

where $H_{ij}(w)$ i,j=1,2 are the Fourier transforms of $h_{ij}[n]$ i,j=1,2, respectively.

The outputs $y_1[n]$ and $y_2[n]$ of a 2×2 LTI system are related to its inputs $s_1[n]$ and $s_2[n]$ by:

$$y_1[n]=h_{11}[n]os_1[n]+h_{12}[n]os_2[n]$$

$$y_2[n]=h_{21}[n]os_1[n]+h_{22}[n]os_2[n]$$

We remark that the time index n and hence the frequency index w, may be vectors. All results presented here holds also for vector valued time and frequency indecies, $\underline{n}$ and $\underline{w}$. As an example, consider the case where $s_1[n]$ and $s_2[n]$ are images, then the index n represents the location vector $(n_x, n_y)$, and the index w represents the spatial frequency vector $(w_x, w_y)$. For simplicity of notations we shall always refer to scalar valued indecies.

B. Cumulants and Polyspectra

Let $x_1, x_2, \ldots, x_k$ be a set of real valued random variables possessing the joint characteristic function:

$$\phi(\underline{w}) = E\{e^{j\underline{w}^T\underline{x}}\} = E\left\{ e^{j\sum_{i=1}^{k} w_i x_i} \right\}$$

where $j=\sqrt{-1}$, and $E\{.\}$ stands for the expectation operation. The joint cumulant of $x_1, \ldots, x_k$, is defined by:

$$\text{cum}(x_1, x_2, \ldots, x_k) = (-j)^k \frac{\partial^k \ln \phi(\underline{w})}{\partial w_1 \partial w_2 \ldots \partial w_k}\bigg|_{\underline{w}=0}$$

where ln(.) stands for the natural logarithm. We note that if $x_1, x_2, \ldots$ are zero mean then $$\text{cum}(x_1)=E\{x_1\}=0$$

$$\text{cum}(x_1, x_2)=E\{x_1 x_2\}$$

$$\text{cum}(x_1, x_2, x_3)=E\{x_1 x_2 x_3\}$$

$$\text{cum}(x_1, x_2, x_3, x_4)=E\{x_1 x_2 x_3 x_4\}-E\{x_1 x_2\}E\{x_3 x_4\}-E\{x_1 x_3\}E\{x_2 x_4\}E\{x_2 x_4\}-E\{x_1 x_4\}E\{x_2 x_3\}$$

The following properties can easily be verified:

(p.1) Linearity: cum $(\ldots, \Sigma_i b_i x_i, \ldots)=\Sigma_i b_i \text{cum}(\ldots, x_i, \ldots)$ (p.2) If $x_1, \ldots, x_k$ can be divided into two or more statistically independent subsets, then $$\text{cum}(x_1, \ldots, x_k)=0$$

(p.3) If $x_1, \ldots, x_k$ are jointly Gaussian then $$\text{cum}(x_1, \ldots, x_k)=0$$

whenever k>2.

Let $x_o[n], x_1[n], \ldots, x_k[n]$ be jointly stationary discrete-time random processes. Then, their joint k-order spectrum (polyspectrum), is defined by:

$$P_{x_0 \ldots x_k}(w_1 \ldots w_k) =$$

$$\sum_{\tau_1} \ldots \sum_{\tau_k} \text{cum}(x_0[n], x_1[n-\tau_1], \ldots, x_k[n-\tau_k]) e^{-j \sum_{i=1}^{k} w_i \tau_i}$$

We note that $P_{x_0 x_0}(w)$ is the power spectrum of $x_0[n]$, $P_{x_0 x_1}(w)$ is the cross-spectrum between $x_0[n]$ and $x_1[n]$, $P_{x_0 x_0 x_0}(w_1, w_2)$ is the second-order polyspectrum, or bispectrum, of $x_0[n]$, $P_{x_0 x_1 x_2}(w_1, w_2)$ is the cross-bispectrum between the indicated processes, $P_{x_0 x_0 x_0 x_0}(w_1, w_2, w_3)$ is the third-order polyspectrum, or trispectrum, of $x_0[n]$, etc.

(p.4) If $x_0[n], x_1[n], \ldots, x_k[n]$ can be divided into two or more statistically independent subsets of processes, then by (p.2)

$$P_{x_0, x_1, \ldots, x_k}(w_1, w_2, \ldots, w_k)=0$$

(p.5) If $x_0[n], x_1[n], \ldots, x_k[n]$ are jointly Gaussian then by (p.3)

$$P_{x_0, x_1, \ldots, x_k}(w_1, w_2, \ldots, w_k)=0$$

whenever $k \geq 2$.

(p.6) Transition of polyspectra through multi-input-multi-output LTI system: Let $$y_i[n] = \sum_{j=0}^{k} h_{ij}[n] o x_j[n]$$
$$i = 0, 1, \ldots, l$$

where $h_{ij}[n]$ is the unit sample response of a stable SISO LTI system whose frequency response is $H_{ij}(w)$. Then, $$P_{y_0 y_1 \ldots y_l}(w_1, w_2, \ldots, w_l) = \sum_{j_0=0}^{k} \ldots \sum_{j_l=0}^{k} H_{0j_0}\left(-\sum_{i=1}^{l} w_i\right) H_{1j_1}(w_1) \ldots H_{lj_l}(w_l) P_{x_{j_0} x_{j_1} \ldots x_{j_l}}(w_1, w_2, \ldots, w_l).$$

SUMMARY OF THE INVENTION

The invention proposes an approach to estimate a plurality of input source signals, which passed through an unknown system. It suggests, in fact, a solution of the problem of signal separation from their coupled observations. In the two channel case, the invention suggests an approach to estimate the desired signal (i.e., to cancel the interfering signal) or to estimate both source signals.

In the above-cited Pat. No. 5,208,786, it is suggested to separate and recover the input (source) signals by imposing the condition that the reconstructed signals be statistically uncorrelated. As it turns out, this condition is insufficient to uniquely solve the problem, unless we make certain assumptions concerning the unknown channel, e.g. that it is a 2×2 FIR filter. In order to solve the problem without any restrictive assumptions concerning the unknown channel, it is further suggested in that patent application to use high order statistics (e.g. polyspectra). In this invention we develop this approach, and find sufficient conditions involving cross-bispectrum, or cross-trispectrum, or any higher-order non-zero cross-polyspectra of the reconstructed signals. By imposing these conditions, we obtain a class of criteria for signal separation.

According to the present invention, there is provided a signal processing system for separating signals received from plural sources via an unknown channel, comprising: a plurality of detectors each for detecting said signals received from said plural sources; and a processor for receiving the detected signals and producing a reconstruction filter for filtering the detected signals to produce reconstructed source signals in which each source signal is reconstructed without interference from the other source signals; characterized in producing the reconstruction filter such that higher order cross-polyspectra of the reconstructed signals are forced to approach zero.

More particularly, the invention comprises a signal processing system including a plurality of detectors for receiving plural observed signals, which results from plural source signals subjected to said system. A processor receives the observed signals, and produces a reconstruction filter such that some cross-polyspectra of the reconstructed signals are zero, or near zero. The main idea of this invention is to impose conditions on the reconstructed signals using their cross-polyspectra. These conditions cause the reconstructed signals to be statistically independent. If the reconstructed signals are statistically independent it implies that the source signals, which became statistically dependent in the observation due to coupling, are separated at reconstruction. The proposed method is universal in the sense that no assumptions are made about the source signals, except that they are statistically independent.

If one transfer function (or unit sample response) of the reconstruction filter is known, then the other transfer function (or unit sample response) can be estimated.

In another related embodiment, the processor that produces the reconstruction filter is adaptive. The processor updates the components of the reconstruction filter as more data is available, and based on the previous estimate of the input source signal. This embodiment represents a class of possible algorithms of various methods for sequential updating of the reconstruction filter.

One application of the invention would be in a signal enhancing scenario in a room. The first microphone is located near the speaker and the other microphone is located near the noise source. The first microphone detects the desired speech signal with some noise, and the second microphone detects the noise with some speech signal. The coupling is due to the unknown acoustic room environment. The processor of the invention is used to reconstruct the desired speech signal without the interfering noise. When the second signal source is another speaker, the processor of the invention separates both speech signals from the detected microphone signals that contain their coupled measurements. In the context of speech signals, the invention processor can be used as a front-end in automatic speech recognition systems operating in noisy environments, or when there is a cross-talk from an interfering speaker.

Although in the above examples we mainly discussed speech enhancement problems, the system for multi-channel signal separation can be applied to many different areas. For example, separating several mixed images, cancellation of noise signals in telemetry system. Also, superimposed/interfering signals in an antenna system can be separated/canceled using the proposed methods.

The above and other features of the invention including various novel details of construction and combinations of parts will now be more particularly described with reference to the accompanying drawings and pointed out in the claims. It will be understood that the particular choice embodying the invention is shown by way of illustration only and not as limitation of this invention. The principles and features of this invention may be employed in various and numerous embodiments without departing from the scope of the invention.

DETAILED DESCRIPTION OF THE INVENTION

Figure 3:
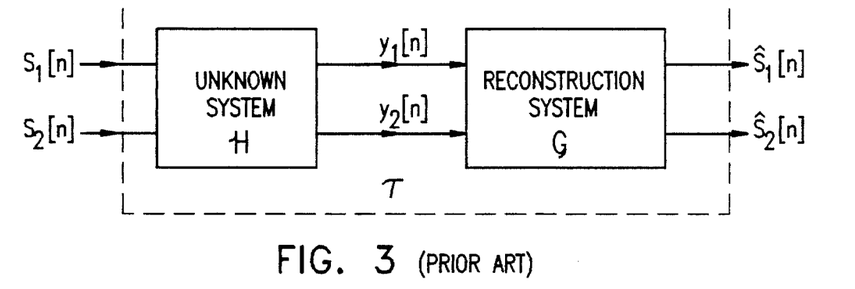
FIG. 3 illustrates the LTI two channel signal separation problem.

In the two channel case, the basic problem of interest is illustrated in FIG. 3. We observe the outputs $y_1[n]$ and $y_2[n]$ of an unknown 2×2 stable LTI system H whose inputs are $s_1[n]$ and $s_2[n]$, and whose frequency response is:

$$H[w] = \begin{bmatrix} H_{11}[w] & H_{12}[w] \\ H_{21}[w] & H_{22}[w] \end{bmatrix} \quad (1)$$

where $H_{ij}(w)$ is the frequency response of the system from input $s_j[n]$ to output $y_i[n]$.

We wish to recover the input signals by using a 2×2 reconstructing filter G, adjusted by the processor, whose outputs are denoted by $v_1[n]$ and $v_2[n]$, and whose frequency response is:

$$g(w) = \begin{bmatrix} G_{11}(w) & -G_{12}(w) \\ -G_{21}(w) & G_{22}(w) \end{bmatrix} \quad (2)$$

Thus, if we denote by $T(w)=g(w)H(w)$ the frequency response of the combined system, then we want to adjust the components of $g(w)$ so that $T(w)$ is of the form:

$$T(w) = \begin{bmatrix} T_{11}(w) & 0 \\ 0 & T_{22}(w) \end{bmatrix} \quad (3)$$

or of the form:

$$T(w) = \begin{bmatrix} 0 & T_{12}(w) \\ T_{21}(w) & 0 \end{bmatrix} \quad (4)$$

If we further require that $T_{11}(w)=T_{22}(w)=1$ $\forall w$ in (3), or that $T_{12}(w)=T_{21}(w)=1$ $\forall w$ in (4), then in the first case we have $v_1[n]=s_1[n]$ and $v_2[n]=s_2[n]$, in the second case $v_1[n]=s_2[n]$ and $v_2[n]=s_1[n]$, and the input signals are exactly recovered. However, since our main goal is the separation of the input signals, it may be sufficient to eliminate the cross-coupling effects and to recover $s_1[n]$ and $s_2[n]$ up to shaping filters. If we want to solve the remaining single-channel deconvolution problems (i.e., to force $T_{11}(w)=T_{22}(w)=1$ $\forall w$ in (3), or $T_{12}(w)=T_{21}(w)=I$ $\forall w$ in (4)), we need to have some prior knowledge concerning the nature of $s_1[n]$ and $s_2[n]$, e.g. that they are sequences of independent identical distributed (i.i.d.) random variables with known average power.

By straightforward matrix multiplication we find that $T(w)=g(w)H(w)$ is of the form of (3) if $$G_{11}(w)H_{12}(w)-G_{12}(w)H_{22}(w)=0 \quad (5)$$

$$-G_{21}(w)H_{11}(w)+G_{22}(w)H_{21}(w)=0 \quad (6)$$

and it is of the form of (4) if $$G_{11}(w)H_{11}(w)-G_{12}(w)H_{21}(w)=0 \quad (7)$$

$$-G_{21}(w)H_{12}(w)+G_{22}(w)H_{22}(w)=0 \quad (8)$$

Clearly, there are infinitely many combinations of $G_{ij}(w)$ i,j=1,2 that satisfy the equation pair (5) (6), or the equation pair (7) (8). Therefore, we may arbitrarily set $G_{11}$ and $G_{22}$ to be unity transformations, i.e.

$$G_{11}(w)=G_{22}(w)=1 \ \forall w \quad (9)$$

and only adjust the decoupling filters $G_{12}$ and $G_{21}$. In this case, the solution to (5) (6) is given by:

$$G_{12}(w) = \frac{H_{12}(w)}{H_{22}(w)}, \ G_{21}(w) = \frac{H_{21}(w)}{H_{11}(w)}, \quad (10)$$

and the solution to (7) (8) is given by:

$$G_{12}(w) = \frac{H_{11}(w)}{H_{21}(w)}, \ G_{21}(w) = \frac{H_{22}(w)}{H_{12}(w)}, \quad (11)$$

Figure 4:
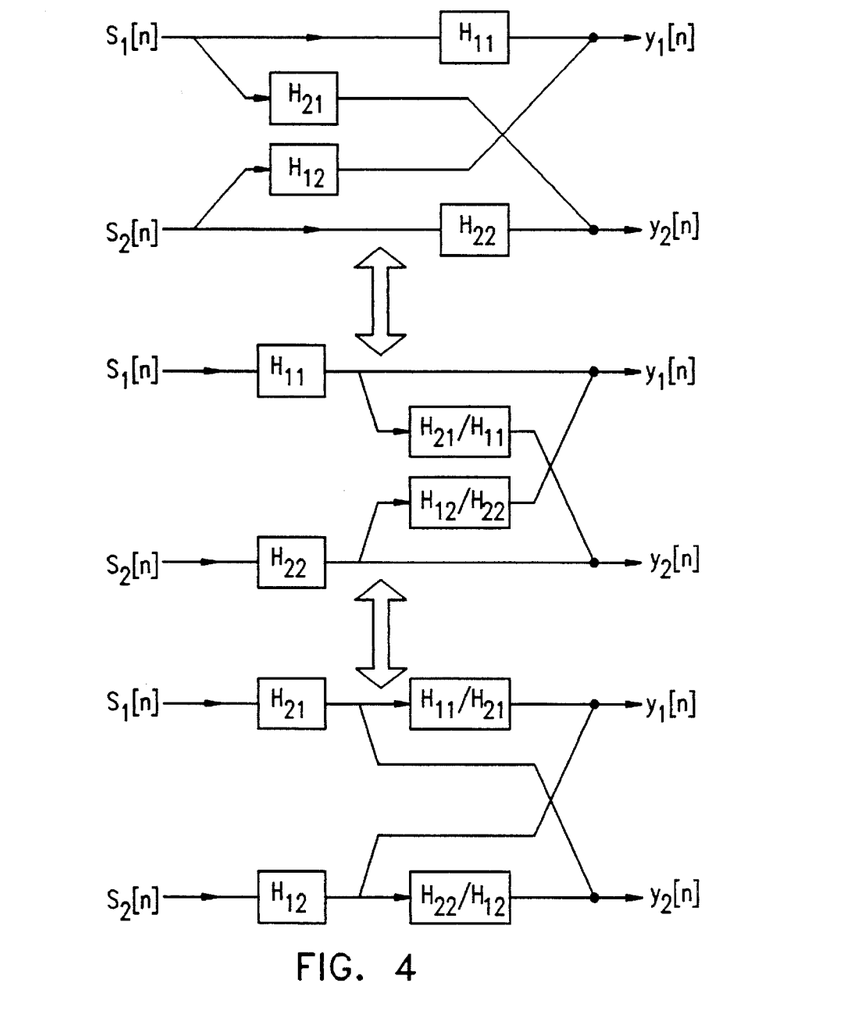
FIG. 4 illustrates the equivalent forms of the unknown system.

These solutions should be expected since if $s_1[n]$ and $s_2[n]$ are statistically independent, then $s_1[n]$ through $H_{11}$ and $s_2[n]$ through $H_{22}$, or $s_1[n]$ through $H_{21}$ and $s_2[n]$ through $H_{12}$, are also statistically independent. Therefore, based on the statistical independence condition, we can only identify the $H_{12}/H_{22}$ and $H_{21}/H_{11}$, or the pair $H_{11}/H_{21}$ and $H_{22}/H_{12}$, as illustrated in FIG. 4. Of course if $H_{ij}$ i,j=1, 2 were known then by setting the decoupling systems $G_{12}$ and $G_{21}$ to satisfy (10) or (11), we obtain the desired signal separation. However, since $H_{ij}$ are unknown, we need to find a method or criterion that blindly yields one of the desired solutions.

We note that we may use a reconstruction system of the form:

$$g(w) = \frac{1}{1-G_{12}(w)G_{21}(w)} \begin{bmatrix} 1 & -G_{12}(w) \\ -G_{21}(w) & 1 \end{bmatrix}. \quad (12)$$

Figure 5:
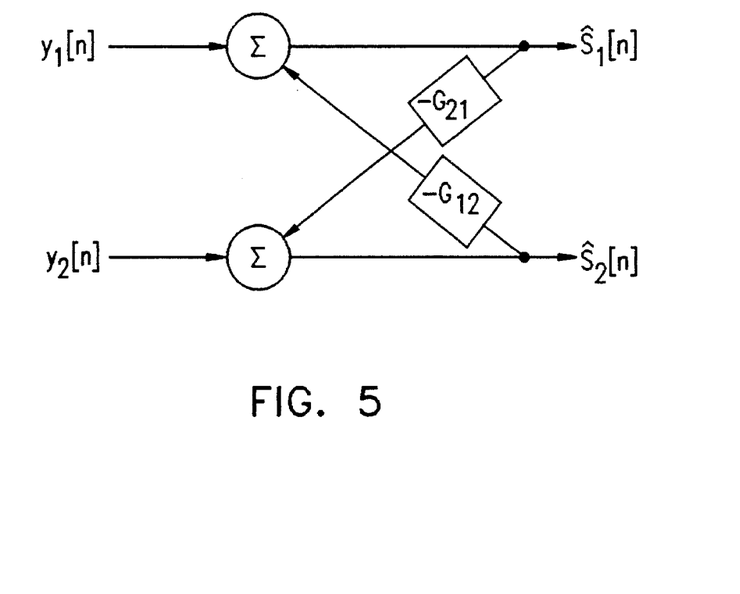
FIG. 5 illustrates one possible structure of the reconstruction system.

A possible realization of this scheme is shown in FIG. 5. If we have found the solution in (10), then $T_{11}(w)=_{11}(w)$ and $T_{22}(w)=H_{22}(w)$, and we have exactly recovered the signals that would have been measured in each sensor in the absence of the other source signal. Similarly, if we have found the solution in (11) then $T_{12}(w)=H_{12}(w)$ and $T_{21}(w)=H_{21}(w)$, and once again we have recovered the signals that would have been measured separately, only that in this case we switch the terminals. This could be useful in many practical situations. For example, in the problem of separating competing speakers, if each speaker is located near a microphone then $H_{11}$ and $H_{22}$ are nearly unity in which case the original speech signals can be recovered with very little distortion.

Figure 1:
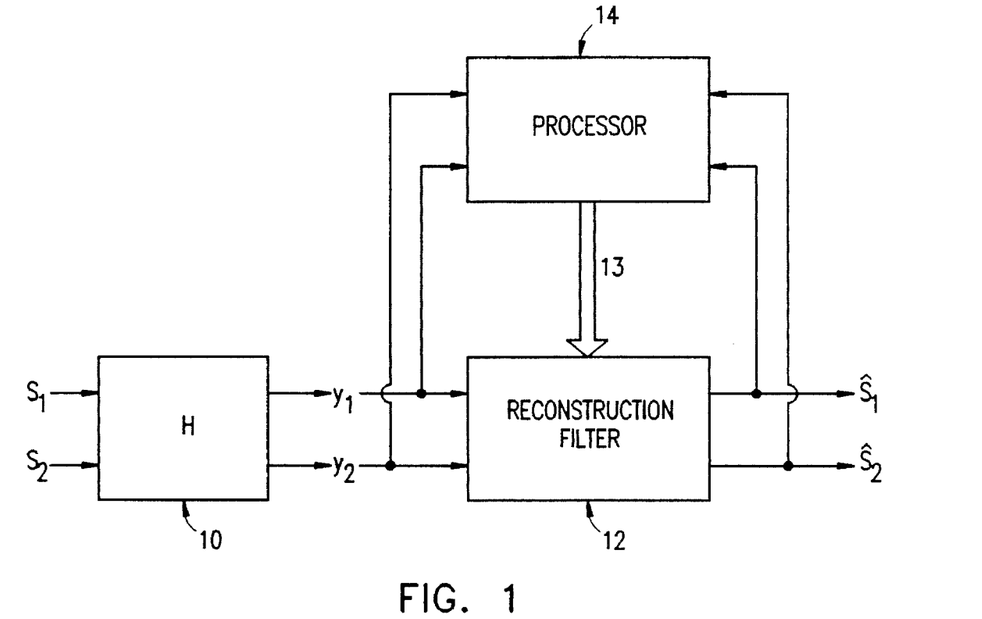
FIG. 1 is a schematic illustration of a general signal processing system embodying the present invention.
Figure 2:
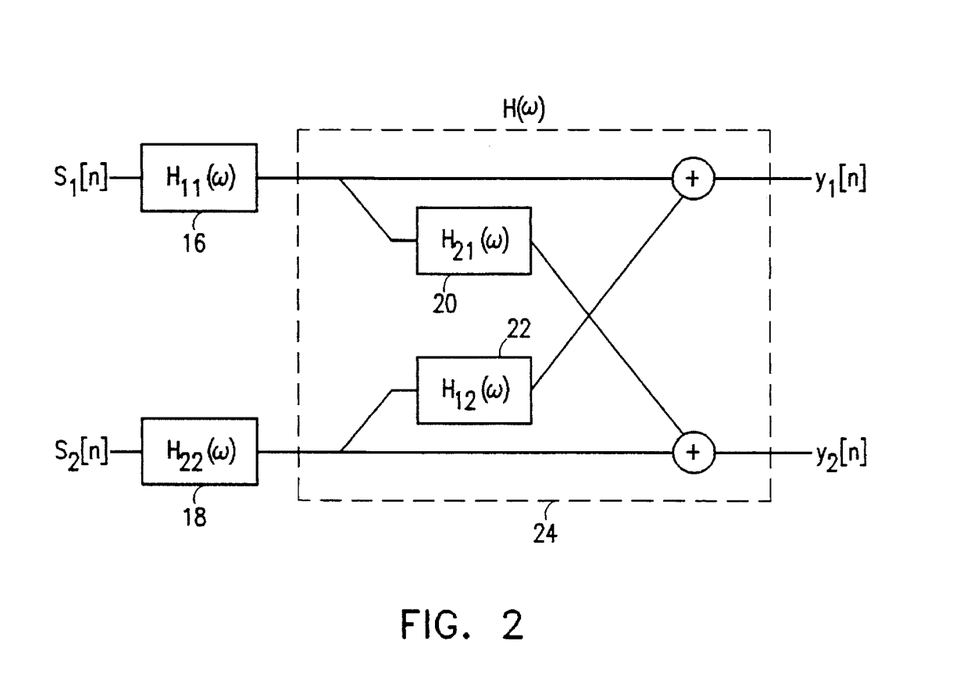
FIG. 2 illustrates a general two channel LTI system where $H_{ij}(w)$ i,j=1,2 represent the transfer function of four SISO systems.

FIG. 1 illustrates schematically the operation of the signal separator of the invention. Two signals $s_1[n]$ and $s_2[n]$ are processed by an environment 10 which is represented by a transfer function H. FIG. 2 shows the transfer function H in more detail. The transfer function H produces output signals $y_1[n]$ and $y_2[n]$. The environment 10 represented by H produces coupling or cross talk in both output signals $y_1[n]$ and $y_2[n]$. The processor 14 and the reconstruction filter 12 operate under the criterion that the reconstructed source signals denoted by $v_1[n]$ (or $\hat{s}_1[n]$) and $v_2[n]$ (or $\hat{s}_2[n]$), are forced to possess some zero cross high-order polyspectra.

If the processor 14 adjust the decoupling systems $G_{12}(w)$ and $G_{21}(w)$ so that two or more cross-polyspectra of orders $k \geq 2$ are zero or nearly zero then the frequency response $T(w)=g(w)Hw)$ of the combined system is of the desired form (3) or (4), and the signals are separated and recovered up to shaping filters.

A. Estimation based on the cross-bispectrum (3rd-order cross-cumulants) and the cross-trispectrum (4th-order cross-cumulants)

We shall now concentrate on criteria and algorithms obtained when using our approach with cross-polyspectra of order k=2, that is the bispectrum and of order k=3 that is the trispectrum.

It can be verified that if the processor 14 adjusts the reconstruction filter 12 so that:

$$P_{v_1v_1v_2}(w_1, w_2)=0 \ \forall w_1, w_2 \quad (13)$$

$$P_{v_2v_2v_1}(w_1, w_2)=0 \ \forall w_1, w_2 \quad (14)$$

then T(w) must be in the form of (3) or (4). In fact, it is sufficient that (13) and (14) holds only for a partial set of frequencies, e.g., $-\pi < w_1 \leq \pi$, $w_2=0$.

The cross-polyspectra of the reconstructed signals can be expressed in terms of the components $G_{12}(w)$ and $G_{21}(w)$ and the polyspectra of the observed (measured) signals. We obtain (several, at least) two equations that can be solved explicitly in the frequency or the time domains, to find the desired decoupling filters $G_{12}(w)$ and $G_{21}(w)$.

Figure 10:
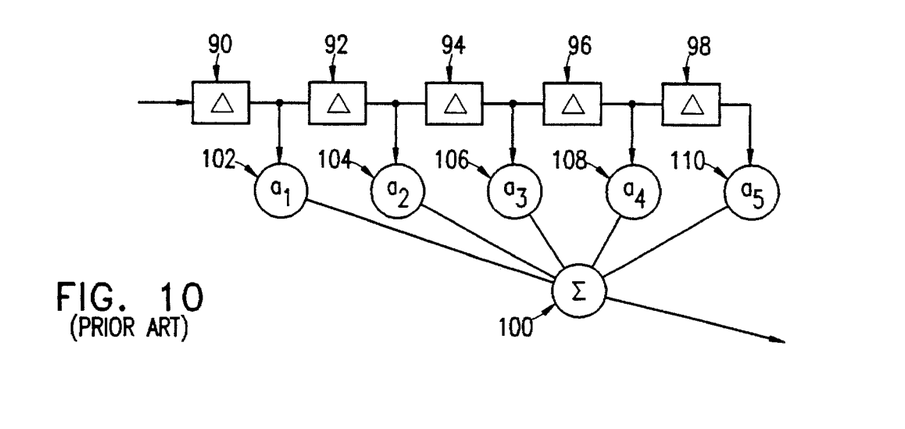
FIG. 10 illustrates a tapped delay line (an FIR filter).

We shall now concentrate on time domain algorithms which evolve from (13) (14). For that purpose we let $G_{12}$ and $G_{21}$ be casual finite impulse response (FIR) filters (see FIG. 10) of the form:

$$G_{12}(w) = \sum_{k=0}^{q_1} a_k e^{-jwk} \quad (15)$$

$$G_{21}(w) = \sum_{k=0}^{q_2} b_k e^{-jwk} \quad (16)$$

where $q_1$ and $q_2$ are some pre-specified filter orders, in which case the reconstructed signals $v_1[n]$ and $v_2[n]$ are given by:

$$v_1[n] = y_1[n] - \sum_{k=0}^{q_1} a_k y_2[n-k] \quad (17)$$

$$v_2[n] = y_2[n] - \sum_{k=0}^{q_2} b_k y_1[n-k] \quad (18)$$

In this setting the problem is reduced to that of adjusting the filter coefficients $a_k$'s and $b_k$'s to satisfy the selected criterion equations.

Consider first the criterion suggested by (13) (14). Inverse Fourier transforming the equations $$cum(v_1[n],v_1[n-\tau_1],v_2[n-\tau_2])=0 \ \forall \tau_1,\tau_2 \quad (19)$$

$$cum(v_2[n],v_2[n-\tau_1],v_1[n-\tau_2])=0 \ \forall \tau_1,\tau_2 \quad (20)$$

Substituting (18) into (19), and (17) to (20), we obtain:

$$\sum_{k=0}^{q_1} a_k \ cum(v_2[n], v_2[n-\tau_1], y_2[n-\tau_2-k]) = \quad (21)$$
$$= cum(v_2[n], v_2[n-\tau_1], y_1[n-\tau_2]) \forall \tau_1, \tau_2$$

$$\sum_{k=0}^{q_2} b_k \ cum(v_1[n], v_1[n-\tau_1], y_1[n-\tau_2-k]) = \quad (22)$$
$$= cum(v_1[n], v_1[n-\tau_1], y_2[n-\tau_2]) \forall \tau_1, \tau_2$$

Since the cumulants are unknown, they are approximated by their sample estimates. Assuming for simplicity that $s_i[n]$ i=1, 2 are zero mean, $$cum(v_i[n], v_i[n-\tau_1], y_j[n-\tau_2-k]) = \quad (23)$$

-continued $$E\{v_i[n]v_i[n-\tau_1]y_j[n-\tau_2-k]\} \approx$$

$$\frac{1}{N} \sum_{n=1}^{N} v_i[n]v_i[n-\tau_1]y_i[n-\tau_2-k] \quad i,j \in \{1,2\}$$

Since (21) and (22) are satisfied for all combinations of $\tau_1$ and $\tau_2$, we have an overdetermined set of equations to solve for the $a_k$'s and $b_k$'s. Writing (21) (22) in matrix form for some values of $\tau_1$, $\tau_2$ (e.g., $|\tau_1|, |\tau_2| \leq M$, for some positive integer, M), we obtain:

$$M_{\underline{b}}\underline{a} = \underline{v}_{\underline{b}} \qquad (24)$$

$$M_{\underline{a}}\underline{b} = \underline{v}_{\underline{a}} \qquad (25)$$

where the ith row of the matrix $M_{\underline{b}}$ is $$M_{\underline{b}i} = [cum(v_2[n], v_2[n-\tau_{1i}], y_2[n-\tau_{2i}]), \ldots, cum(v_2[n], v_2[n-\tau_{1i}], y_2[n-\tau_{2i}-q_1])] | \tau_{1i}, \tau_{wi} \in B, \qquad (26)$$

the i th element of the vector $\underline{v}_{\underline{b}}$ is $$v_{\underline{b}i} = cum(v_2[n], v_2[n-\tau_{1i}], y_1[n-\tau_{2i}]) \quad \tau_{1i}, \tau_{2i} \in B, \qquad (27)$$

and similarly the ith row of the matrix $M_{\underline{a}}$ is $$M_{\underline{a}i} = [cum(v_1[n], v_1[n-\tau_{1i}], y_1[n-\tau_{2i}]), \ldots, cum(v_1[n], v_1[n-\tau_{1i}], y_1[n-\tau_{2i}-q_1])] | \tau_{1i}, \tau_{wi} \in B, \qquad (28)$$

and the i th element of the vector $\underline{v}_{\underline{a}}$ is $$v_{\underline{a}i} = cum(v_1[n], v_1[n-\tau_{1i}], y_2[n-\tau_{2i}]) \quad \tau_{1i}, \tau_{2i} \in B, \qquad (29)$$

for some preselected set of integers B. The form of equations (24) (25) suggest an iterative algorithm in which we alternate between solving (24) for the $a_k$'s using the current $b_k$'s, and solving (25) for the $b_k$'s using the current $a_k$'s. Each iteration cycle involves the solution to a standard linear least squares problem.

Figure 7A:
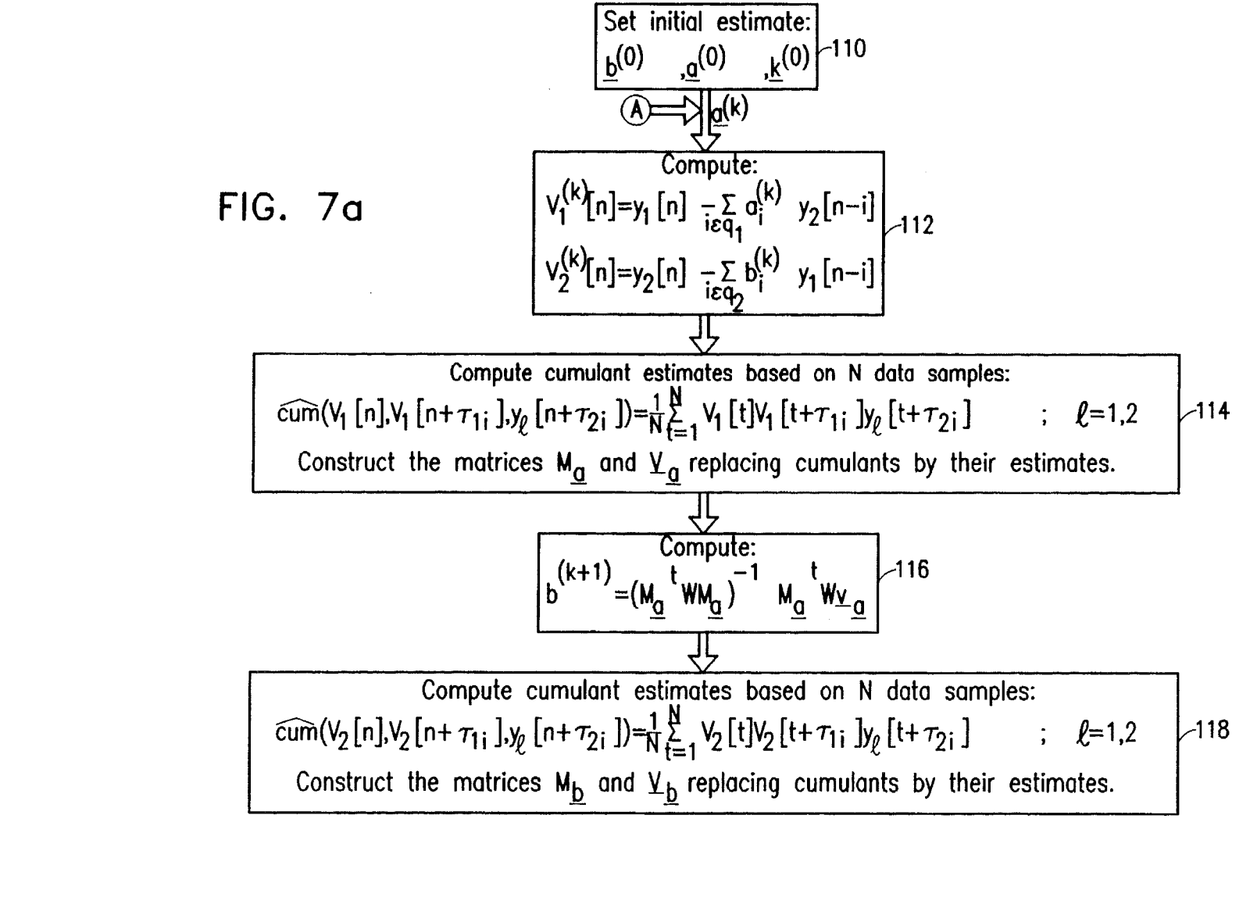
FIGS. 7a and 7b together illustrate an embodiment of the signal processing system that implements an iterative process for estimating the coupling systems.
Figure 7B:
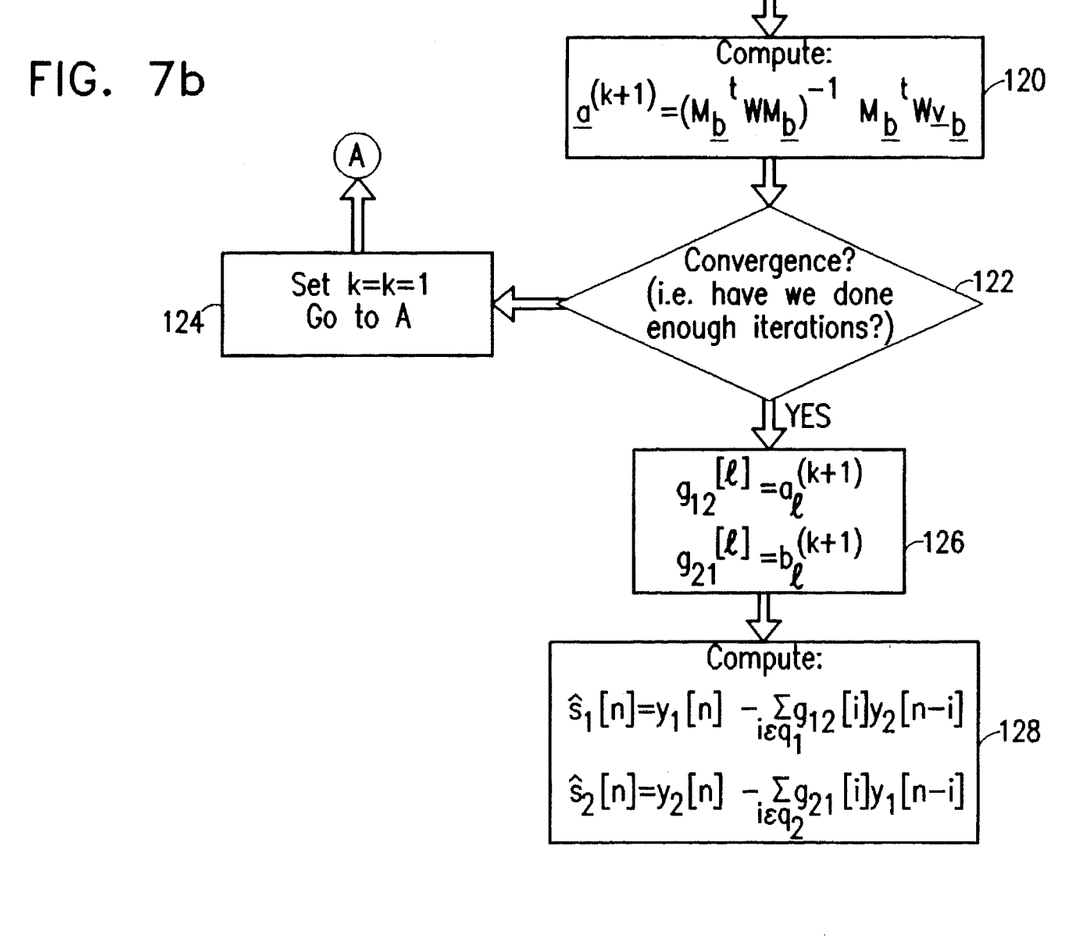

The flow chart in FIGS. 7a and 7b illustrates the iterative algorithm which estimates $\underline{a}$ and $\underline{b}$ iteratively using Equations (24) (25). Then generating $v_1[n]$ and $v_2[n]$ using the new $\underline{a}$ and $\underline{b}$ according to (17) and (18), respectively. Block 110 illustrates the setting of the initial estimates of $\underline{a}$ and $\underline{b}$ and setting the iteration index k to zero. As shown in block 112, $v_1[n]$ and $v_2[n]$ are calculated using $\underline{a}^{(k)}$ and $\underline{b}^{(k)}$ and the detected signals, $y_1[n]$ and $y_2[n]$, in accordance with equations (17) (18), respectively. The value $v_1[n]$ is used to compute the cumulant estimators required for the construction of $M_{\underline{a}}$ and $\underline{v}_{\underline{a}}$ in block 114. In block 116 the new value for $\underline{b}$ is computed by solving the least squares problem of (25), i.e., $$\underline{b}^{(k+1)} = (M_{\underline{a}}^T W M_{\underline{a}})^{-1} M_{\underline{a}}^T W \underline{v}_{\underline{a}}. \qquad (30)$$

where W is a prespecified weighting matrix. In block 118 the value $v_2[n]$ is used to compute the cumulant estimators required for the construction of $M_{\underline{b}}$ and $\underline{v}_{\underline{b}}$, and in block 120 the new value for $\underline{a}$ is computed by solving the least squares problem of (24), i.e., $$\underline{a}^{(k+1)} = (M_{\underline{b}}^T W M_{\underline{b}})^{-1} M_{\underline{b}}^T W \underline{v}_{\underline{b}}. \qquad (31)$$

Block 122 determines whether convergence has occurred. If more iterations need to be calculated, k is set equal to k+1 and calculation are restarted in block 112. If convergence has occurred, the values for $\underline{a}^{(k+1)}$ and $\underline{b}^{(k+1)}$ are set equal to $g_{12}[n]$ and $g_{21}[n]$, respectively. Where $g_{ij}[n]$ are the unit sample response of $G_{ij}(w)$ $i,j=1,2$ $i \neq j$. The estimators of the input signals are now computed using $g_{12}[n]$ and $g_{21}[n]$ in Block 128.

Now we shall derive similar algorithms based on the trispectrum or the 4th-order cross-cumulants. It can be verified that if the processor 14 adjusts the reconstruction filter 12 so that:

$$P_{v_1v_1v_1v_2}(w_1, w_2w_3) = 0 \quad \forall w_1, w_2, w_3 \qquad (32)$$

$$P_{v_2v_2v_2v_1}(w_1, w_2w_3) = 0 \quad \forall w_1, w_2, w_3 \qquad (33)$$

then T(w) must be of the form of (3) or (4). In fact, it is sufficient that (32) and (33) holds only for a partial set of frequencies, e.g., $-\pi < w_1 = w_2 \leq \pi$, $w_3 = 0$.

Inverse Fourier transforming the criterion suggested by (32) (33) and using (17) and (18), we obtain:

$$\sum_{k=0}^{q_1} a_k \, cum(v_2[n], v_2[n-\tau_1], v_2[n-\tau_2], y_2[n-\tau_3-k]) = \qquad (34)$$
$$= cum(v_2[n], v_2[n-\tau_1], v_2[n-\tau_2], y_1[n-\tau_3]) \forall \tau_1, \tau_2, \tau_3$$

$$\sum_{k=0}^{q_2} b_k \, cum(v_1[n], v_1[n-\tau_1], v_1[n-\tau_2], y_1[n-\tau_3-k]) = \qquad (35)$$
$$= cum(v_1[n], v_1[n-\tau_1], v_1[n-\tau_2], y_2[n-\tau_3]) \forall \tau_1, \tau_2, \tau_3$$

Since (34) and (35) are satisfied for all combinations of $\tau_1$, $\tau_2$ and $\tau_3$, we have an overdetermined set of equations to solve for the $a_k$'s and $b_k$'s. Writing (34) (35) in matrix form for some values of $\tau_1$, $\tau_2$, $\tau_3$ (e.g., $|\tau_1|, |\tau_2|, |\tau_3| \leq M$, for some positive integer, M), we obtain:

$$M_{\underline{b}}\underline{a} = \underline{v}_{\underline{b}} \qquad (36)$$

$$M_{\underline{a}}\underline{b} = \underline{v}_{\underline{a}} \qquad (37)$$

Once again, the form of these equations suggests an iterative procedure in which we substitute the current values of $b_k$'s in (36) to obtain a new set of $a_k$'s and the current values of $a_k$'s in (37) to obtain a new set of $b_k$'s. Each iteration cycle involves the solution to a standard linear least squares problem. Of course, in the actual implementation of the algorithm the cumulants appearing in (34) and (35) are substituted by their sample estimates.

We may combine several pairs of criterion equations in order to improve statistical stability. It is straightforward to devise an algorithm in which we iteratively solve the combined (21) and (34) for the $a_k$'s, and the combined (22) and (35) for the $b_k$'s. We may assign different weights to different equations (i.e., using a weighted least squares solution) to reflect the statistical variability of say third-order empirical cumulants to fourth-order empirical cumulants.

The above algorithms can easily be phrased in terms of any other cross high-order polyspectra (or cumulants). The processor 14 of FIG. 1 is aimed to produce a reconstruction filter 12 so that its outputs possess some high-order cross-polyspectra near zero.

B. Combining the Decorrelation Criterion

We may also consider incorporating the decorrelation criterion proposed in the above-cited patent application Ser. No. 07/750,917, with our proposed criteria. The decorrelation condition requires that the reconstructed signals $v_1[n]$ and $v_2[n]$ be statistically uncorrelated, or that their cross-spectrum be identically zero, that is $$P_{v_1v_2}(w) = P_{y_1y_2}(w) - G_{12}(w)P_{y_2y_2}(w) - G_{21}^*(w)P_{y_1y_1}(w) + G_{12}(w)G_{21}^*(w)P_{y_2y_1}(w) = 0 \quad \forall w \qquad (38)$$

where $(.)^*$ denotes complex conjugation.

Note that this equation does not specify a unique solution for both $G_{12}$ and $G_{21}$. For any pre-specified $G_{21}$ we can find $G_{12}$ that satisfy the equation, and vise versa.

To combine the decorrelation equation with the other criterion equations, we rewrite (38) in the following two alternative forms:

$$G_{12}(w) = \frac{P_{y1y2}(w) - G_{21}^*(w)P_{y1y1}(w)}{P_{y2y2}(w) - G_{21}^*(w)P_{y2y1}(w)} = \frac{P_{y1v2}(w)}{P_{y2v2}(w)} \quad (39)$$

$$G_{21}(w) = \frac{P_{y2y1}(w) - G_{12}^*(w)P_{y2y2}(w)}{P_{y1y1}(w) - G_{12}^*(w)P_{y1y2}(w)} = \frac{P_{y2v1}(w)}{P_{y1v1}(w)} \quad (40)$$

Transforming (39) and (40) into the time domain:

$$\sum_{k=0}^{q_1} a_k \, \text{cum}(v_2[n], y_2[n-\tau-k]) = \text{cum}(v_2[n], y_1[n-\tau]) \forall \tau \quad (41)$$

$$\sum_{k=0}^{q_2} b_k \, \text{cum}(v_1[n], y_1[n-\tau-k]) = \text{cum}(v_1[n], y_2[n-\tau]) \forall \tau \quad (42)$$

It is straightforward to incorporate these equations with any of the proposed criterion equations, e.g. iterating between solving (21) jointly with (41) for the $a_k$'s, and solving (22) jointly with (42) for the $b_k$'s. Once again, we may assign different weights to different criterion equations so as to reflect the statistical variability of second order empirical cumulants (correlations) to higher-order empirical cumulants.

C. Recursive/Sequential Algorithms

In a variety of applications, it is desirable to process the data recursively/sequentially. The advantage of a recursive/sequential algorithm over a batch algorithm is not necessarily in the final result, but in the computational efficiency, reduced storage requirements and in fact that an outcome may be provided without having to wait for all the data to be processed. Moreover, if the underlying system (channel) exhibits time changes, processing all the available data jointly is not desirable, even if we can accommodate the computational and storage lead of the batch algorithm, since different data segments correspond to different channel responses. In that case we want to have an adaptive algorithm that is capable of tracking the varying characteristics of the channel.

Concatenating the equations in (21) for $\tau_1=0$ and $\tau_2=0, 1, 2, \ldots, q_1$, and the equations in (22) for $\tau_1=0$ and $\tau_2=0, 1, 2, \ldots, q_2$ (so that the number of equations is equal to the number of unknown parameters), and assuming for simplicity zero mean processes, we obtain:

$$E\{\underline{v}_2[n]v_2[n]\underline{y}_2^T[n]\}\underline{a} = E\{\underline{v}_2[n]v_2[n]y_1[n]\} \quad (43)$$

$$E\{\underline{v}_1[n]v_2[n]\underline{y}_1^T[n]\}\underline{b} = E\{\underline{v}_1[n]v_1[n]y_2[n]\} \quad (44)$$

where $$\underline{y}_1[n] = (y_1[n], \ldots, y_1[n-q_2])^T \quad (45)$$

$$\underline{y}_2[n] = (y_2[n], \ldots, y_2[n-q_1])^T \quad (46)$$

$$\underline{v}_1[n] = (v_1[n], \ldots, v_1[n-q_2])^T \quad (47)$$

$$\underline{v}_2[n] = (v_2[n], \ldots, v_2[n-q_1])^T \quad (48)$$

Replacing expectations with sample averages as suggested by (23), we obtain the following iterative-recursive algorithm:

$$a^{(l)}(n) = a^{(l)}(n-1) + \gamma_n Q(n)\underline{v}_2[n]v_2[n]v_1[n]|_{\underline{a}=\underline{a}^{(l)}(n-1), \underline{b}=\underline{b}^{(l-1)}} \quad (49)$$

where $$Q(n) = \frac{1}{1-\gamma_n}\left[Q(n-1) - \frac{\gamma_n Q(n-1)\underline{v}_2[n]v_2[n]\underline{y}_2^T[n]Q(n-1)}{(1-\gamma_n) + \gamma_n \underline{y}_2^T[n]Q(n-1)\underline{v}_2[n]v_2[n]}\right] \quad (50)$$

$$\underline{b}^{(l)}(n) = \underline{b}^{(l)}(n-1) + \gamma_n R(n)\underline{v}_1[n]v_1[n]v_2[n]|_{\underline{a}=\underline{a}^{(l-1)}, \underline{b}=\underline{b}^{(l)}(n-1)} \quad (51)$$

where $$R(n) = \frac{1}{1-\gamma_n}\left[R(n-1) - \frac{\gamma_n R(n-1)\underline{v}_1[n]v_1[n]\underline{y}_1^T[n]R(n-1)}{(1-\gamma_n) + \gamma_n \underline{y}_1^T[n]R(n-1)\underline{v}_1[n]v_1[n]}\right] \quad (52)$$

where $\gamma_n = 1/n$, and $\underline{a}^{(l)}(n)$ and $\underline{b}^{(l)}(n)$ are the values of $\underline{a}$ and $\underline{b}$ at the lth iteration of the algorithm, based on sample averages to time n. The input to the lth iteration cycle are the values $\underline{a}^{(l-1)}$ and $\underline{b}^{(l-1)}$ from the previous iteration cycle. Then, using (49)–(52), the next iteration cycle is performed recursively in n.

If instead of iterating we use the most current values of $\underline{a}$ and $\underline{b}$ along the recursion, we obtain the following sequential algorithm:

$$a(n) = a(n-1) + \gamma_n Q(n)\underline{v}_2[n]v_2[n]v_1[n]|_{\underline{a}=\underline{a}(n-1), \underline{b}=\underline{b}(n-1)} \quad (53)$$

$$\underline{b}(n) = \underline{b}(n-1) + \gamma_n R(n)\underline{v}_1[n]v_1[n]v_2[n]|_{\underline{a}=\underline{a}(n-1), \underline{b}=\underline{b}(n-1)} \quad (54)$$

where a(n) and b(n) are the values of $\underline{a}$ and $\underline{b}$ at time n, and where Q(n) and R(n) are computed recursively using (50) and (52), respectively.

An alternative approach for generating a sequential algorithm, is based on first-order stochastic approximation methods. The resulting algorithm is:

$$\underline{a}(n) = \underline{a}(n-1) + \gamma_n \underline{v}_2[n]v_2[n]v_1[n]|_{a=a(n-1), b=b(n-1)} \quad (55)$$

$$\underline{b}(n) = \underline{b}(n-1) + \gamma_n \underline{v}_1[n]v_1[n]v_2[n]|_{\underline{a}=\underline{a}(n-1), \underline{b}=\underline{b}(n-1)} \quad (56)$$

If we choose $\gamma_n = \gamma$ (a constant), it corresponds to exponential weighting that reduces the effect of past data relative to new data, and we effectively obtain an adaptive algorithm that is capable of tracking the varying characteristics of the channel.

The algorithm in (53) (54) can be viewed as the equivalent of the Recursive Least Squares (RLS) algorithm for the problem in hand, while the algorithm in (55) (56) can be viewed as the equivalent of the Least Mean Squares (LMS) algorithm. We note that similar iterative-recursive and sequential algorithms can be developed for solving the other criterion equations. The possibility of combining several recursive/sequential algorithms corresponding to different criteria equations also exists here.

D. Effect of Additive Noise

Figure 6:
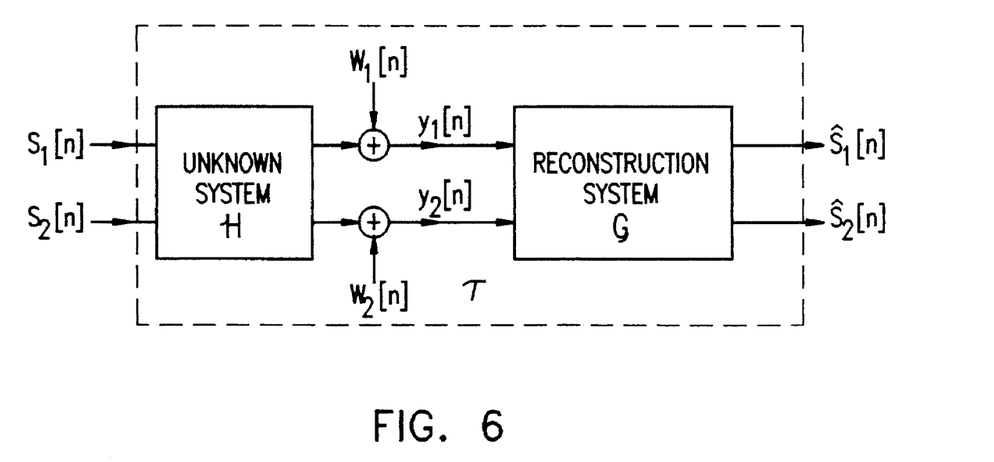
FIG. 6 illustrates the LTI two channel signal separation problem in the presence of additive noise.

Consider the system illustrated in FIG. 6 in which the observed signals $y_1[n]$ and $y_2[n]$ are contaminated by the additive noises $w_1[n]$ and $w_2[n]$, respectively. Then the outputs of the reconstruction filter can be represented as sum of contributions due to the signal and the noise, i.e.

$$v_i[n]=v_i^{(s)}[n]+v_i^{(w)}[n] \quad i=1,2 \tag{57}$$

Assuming that $s_i[n]$ $i=1, 2$ and $w_i[n]$ $i=1, 2$ are statistically independent, $$P_{v_1 v_1 v_2}(w_1,w_2)=P_{v_1^{(s)} v_1^{(s)} v_2^{(s)}}(w_1,w_2)+P_{v_1^{(w)} v_1^{(w)} v_2^{(w)}}(w_1, w_2) \tag{58}$$

where by (p.6)

$$P_{s_i^{(p)} s_j^{(p)} s_k^{(p)}}(w_1, w_2) = \tag{59}$$

$$\sum_{i=1}^{2} \sum_{j=1}^{2} \sum_{k=1}^{2} G_{1i}(-w_1 - w_2) G_{1j}(w_1) G_{2k}(w_2) P_{w_i w_j w_k}(w_1, w_2)$$

If $w_1[n]$ and $w_2[n]$ are statistically independent then all terms of the triple sum in (59) are zero except for $i=j=k$. However, we note that $w_1[n]$ and $w_2[n]$ may be statistically dependent, e.g. they result from a directional interference. If the auto and cross bispectra of the additive noises are known a-priori, or can be measured independently, then $P_{v_1^{(w)} v_1^{(w)} v_2^{(w)}}(w_1,w_2)$ can be calculated separately and then subtracted from (58). Similar subtraction operation can be performed with respect to all other criterion equations.

In the special case where $w_1[n]$ and $w_2[n]$ are jointly Gaussian then by (p.5) all their polyspectra of order $k \geq 2$ are zero, in particular $$P_{w_i w_j w_k}(w_1,w_2)=0 \quad \forall w_1,w_2 \tag{60}$$

for all combinations of $i,j,k \in \{1,2\}$. Therefore, all the proposed criteria are unaffected (blind) to additive Gaussian noise. An exception is the decorrelation criterion of the above-cited patent application Ser. No. 07/750,917 which may be sensitive to correlated Gaussian noises.

In the actual implementation of the algorithms the polyspectra, or the respective cumulants, are substituted by their sample estimates. Therefore, the effect of additive noise is non-zero even in the Gaussian case, and the empirical cross-polyspectra between $v_i^{(s)}[n]$ and $v_i^{(w)}[n]$ $i=1,2$ are also non-zero.

The algorithms previously derived are examples and are not limiting, but merely representative of our general approach in which the signal processing device of the invention can be used.

Figure 8:
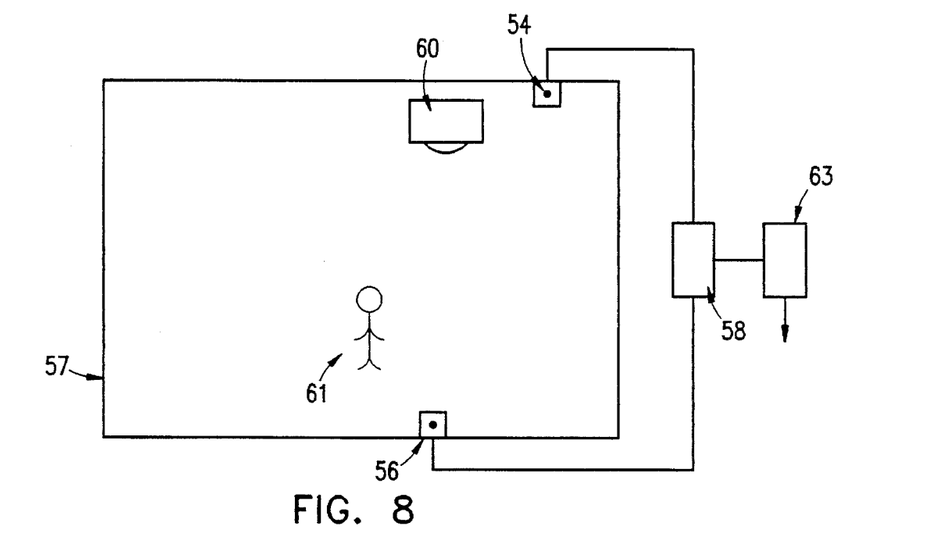
FIG. 8 illustrates a speech enhancing and noise cancellation system using the signal processing circuit of the invention.

FIG. 8 illustrates the use of the invention in a speech enhancing and noise cancellation system. The separation of voice signals from interfering noise signals in a room can be easily accomplished using the signal processing device of the invention. For example, FIG. 8 illustrates an individual 61 in room 57. Also in the room is a noise source 60, such as a TV or a radio. Microphone 54 is located near the noise source 60. Microphone 56 is near the desired signal source from the individual 61. Due to the room acoustics, both signals are picked up by both microphones. The processing and reconstruction device 58 operates on the detected signals in accordance with the principles described above. Thus, the desired signal from source 61 can be derived. The desired signal reconstructed from 58 can then be processed by speech recognition device 63.

The signal separator of the invention can also be used in a moving vehicle, such as a car. A microphone can be located near the muffler and another microphone near the speaker. The speaker's microphone could be a car phone. The noise caused by the muffler can be eliminated by using the signal separator of the invention. Moreover, since some of the generating transfer functions are known or can be calculated from the car acoustical environment, calculations can be simplified in the reconstruction filter.

Figure 9:
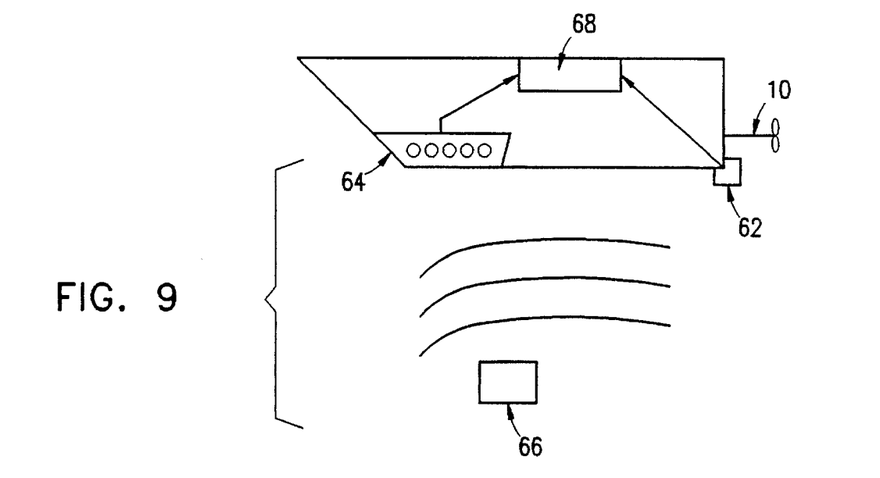
FIG. 9 illustrates a signal enhancing system in an underwater acoustic environment.

FIG. 9 illustrates a signal enhancing system in accordance with the invention in an underwater acoustic environment. A sonar array 64 is used to determine the position of target 66. Noise generated by propeller 70 interferes with this determination. Accordingly, microphone 62 generates an output signal which is processed with the signal from array 64 by signal separation device 68 and an accurate target signal can be calculated.

Those skilled in the art will recognize, or be able to ascertain, using no more than routine experimentation, many equivalents to the specific embodiments of the invention described herein. These and all other equivalents are intended to be encompassed by the following claims.

We claim:

1. A signal processing system for separating signals received from plural sources via an unknown channel, comprising: a plurality of detectors each for detecting said signals received from said plural sources; and a processor for receiving the detected signals and producing a reconstruction filter for filtering the detected signals to produce reconstructed source signals in which each source signal is reconstructed without interference from the other source signals; characterized in producing the reconstruction filter such that higher-order cross-polyspectra of the reconstructed signals are forced to approach zero.

2. A signal processing system according to claim 1, wherein the number of detectors and sources is two, and the reconstruction filter is adjusted so that the following polyspectra of the reconstructed source signals $v_1[n]$ and $v_2[n]$ at the output of the reconstruction filter are forced to approach zero:

$$P_{v_1 v_1 v_2}(w_1,w_2)=0 \quad (w_1,w_2) \in \Omega_2$$

$$P_{v_2 v_2 v_1}(w_1,w_2)=0 \quad (w_1,w_2) \in \Omega_2$$

where $\Omega_2$ is a preselected frequency region.

3. A signal processing system according to claim 1, wherein the number of detectors and sources is two, and the reconstruction filter is adjusted so that the following polyspectra of the reconstructed source signals $v_1[n]$ and $v_2[n]$ at the output of the reconstruction filter are forced to approach zero:

$$P_{v_1 v_1 v_1 v_2}(w_1,w_2,w_3)=0 \quad (w_1,w_2,w_3) \in \Omega_3$$

$$P_{v_2 v_2 v_2 v_1}(w_1,w_2,w_3)=0 \quad (w_1,w_2,w_3) \in \Omega_3$$

where $\Omega_3$ is a preselected frequency region.

4. A signal processing system according to claim 2, wherein the reconstruction filter is adjusted so that the following polyspectra of the reconstructed source signals $v_1[n]$ and $v_2[n]$ at its output are forced to approach zero:

$$P_{v_1 v_1 v_1 v_2}(w_1,w_2,w_3)=0 \quad (w_1,w_2,w_3) \in \Omega_3$$

$$P_{v_2 v_2 v_2 v_1}(w_1,w_2,w_3)=0 \quad (w_1,w_2,w_3) \in \Omega_3$$

where $\Omega_3$ is a preselected frequency region.

5. A signal processing system according to claim 2, wherein the reconstruction filter is adjusted so that the following cross-spectrum of the reconstructed source signals $v_1[n]$ and $v_2[n]$ at the reconstruction filter output is also forced to approach zero:

$$P_{v_1 v_2}(w)=0 \quad w \in \Omega$$

where $\Omega$ is a preselected frequency region.

6. A signal processing system according to claim 3, wherein the reconstruction filter is adjusted so that the following cross-spectrum of the reconstructed source signals $v_1[n]$ and $v_2[n]$ at the reconstruction filter output is also forced to approach zero:

$$P_{v_1 v_2}(w) = 0 \quad w \in \Omega$$

where $\Omega$ is a preselected frequency region.

7. A signal processing system according to claim 4, wherein the reconstruction filter is adjusted so that the following cross-spectrum of the reconstructed source signals $v_1[n]$ and $v_2[n]$ at the reconstruction filter output is also forced to approach zero:

$$P_{v_1 v_2}(w) = 0 \quad w \in \Omega$$

where $\Omega$ is a preselected frequency region.

8. A signal processing system according to claim 2, wherein the reconstruction filter is adjusted so that the following cumulants of the signals $v_1[n]$ and $v_2[n]$ at its output is forced to approach zero:

$$cum(v_1[n], v_1[n-\tau_1], v_2[n-\tau_2]) = 0 \quad (\tau_1, \tau_2) \in B_2$$

$$cum(v_2[n], v_2[n-\tau_1], v_2[n-\tau_2]) = 0 \quad (\tau_1, \tau_2) \in B_2$$

where $B_2$ is a preselected set of integers.

9. A signal processing system according to claim 3, wherein the reconstruction filter is adjusted so that the following cumulants of the signals $v_1[n]$ and $v_2[n]$ at its output is forced to approach zero:

$$cum(v_1[n], v_1[n-\tau_1], v_1[n-\tau_2], v_2[n-\tau_3]) = 0 \quad (\tau_1, \tau_2, \tau_3) \in B_3$$

$$cum(v_2[n], v_2[n-\gamma_1], v_1[n-\gamma_2], v_2[n-\gamma_3]) = 0 \quad (\gamma_1, \gamma_2, \gamma_3) \in B_3$$

where $B_3$ is a preselected set of integers.

10. A signal processing system according to claim 8, wherein the reconstruction filter is adjusted so that the following cumulants of the signals $v_1[n]$ and $v_2[n]$ at its output is forced to approach zero:

$$cum(v_1[n], v_1[n-\tau_1], v_1[n-\tau_2], v_2[n-\tau_3]) = 0 \quad (\tau_1, \tau_2, \tau_3) \in B_3$$

$$cum(v_1[n], v_1[n-\tau_1], v_1[n-\tau_2], v_2[n-\tau_3]) = 0 \quad (\tau_1, \tau_2, \tau_3) \in B_3$$

where $B_3$ is a preselected set of integers.

11. A signal processing system according to claim 8, wherein the reconstruction filter is adjusted so that the following cumulants of the signals $v_1[n]$ and $v_2[n]$ at the reconstruction filter output is also forced to approach zero:

$$cum(v_1[n], v_2[n+\tau[) = 0 \quad \tau \in B$$

where $B$ is a preselected set of integers.

12. A signal processing system according to claim 9, wherein the reconstruction filter is adjusted so that the following cumulants of the signals $v_1[n]$ and $v_2[n]$ at the reconstruction filter output is also forced to approach zero:

$$cum(v_1[n], v_2[n+\tau[) = 0 \quad \tau \in B$$

where $B$ is a preselected set of integers.

13. A signal processing system according to claim 10, wherein the reconstruction filter is adjusted so that the following cumulants of the signals $v_1[n]$ and $v_2[n]$ at the reconstruction filter output is also forced to approach zero:

$$cum(v_1[n], v_2[n+\tau[) = 0 \quad \tau \in B$$

where $B$ is a preselected set of integers.

* * * * *